(12) United States Patent
Snodgrass et al.

(10) Patent No.: US 6,321,356 B1
(45) Date of Patent: Nov. 20, 2001

(54) PROGRAMMABLE PATTERN GENERATOR

(75) Inventors: Charles K. Snodgrass; Bruce A. Dickey, both of Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/314,046

(22) Filed: May 18, 1999

(51) Int. Cl.[7] .................................................. G06F 11/00
(52) U.S. Cl. .............................................................. 714/738
(58) Field of Search ................................... 714/738, 728

(56) References Cited

U.S. PATENT DOCUMENTS

| | | | |
|---|---|---|---|
| 5,263,029 | * 11/1993 | Wicklund | 714/718 |
| 5,265,102 | * 11/1993 | Saito | 714/738 |
| 5,852,618 | * 12/1998 | Fujisaki | 714/738 |
| 5,883,905 | * 3/1999 | Eastburn | 714/738 |
| 6,161,206 | * 12/2000 | Wasson | 714/738 |

\* cited by examiner

*Primary Examiner*—Albert Decady
*Assistant Examiner*—Shelly A Chase
(74) *Attorney, Agent, or Firm*—Williams, Morgan & Amerson, P.C.

(57) ABSTRACT

A pattern generator includes an address generator, an address topology generator, and a data topology generator. The address generator is adapted to provide a first address having a plurality of address bits. The address topology generator includes a first plurality of programmable logic gates. Each programmable logic gate of the first plurality is coupled to receive at least a subset of the plurality of address bits. The first plurality of programmable logic gates generate a second address having a plurality of modified address bits. The data topology generator is adapted to receive at least a subset of the plurality of modified address bits and generate write data based on the subset of modified address bits. A method for generating a pattern includes generating a first address having a plurality of address bits. A second address having a plurality of modified address bits is generated. The second address is a programmable combination of subsets of the address bits. Write data is generated based on a subset of the modified address bits.

63 Claims, 9 Drawing Sheets

| PARM0 602 | PARM1 604 | PARM2 606 | PARM3 608 | ZPARM 610 | ZMODE 612 | AXCTL 614 | BXCTL 616 |
|---|---|---|---|---|---|---|---|
| 07FF | 0000 | 0000 | 0000 | 0 | 0 | 2 | 4 |
| 0000 | 0000 | 01FF | 0000 | 0 | 0 | 4 | 4 |
| 0003 | 0000 | FFFE | 0000 | 0 | 0 | 4 | 4 |
| FFFF | 0001 | 0001 | 0000 | 0 | 0 | 4 | 6 |

| AYCTL 618 | BYCTL 620 | ABXMUX 622 | ABYMUX 624 | ABXMODE 626 | ABYMODE 628 | STORE0 630 |
|---|---|---|---|---|---|---|
| 4 | 4 | 1 | 0 | 0 | 0 | 1F |
| 2 | 4 | 0 | 0 | 0 | 0 | 1F |
| 6 | 4 | 0 | 0 | 0 | 0 | 11 |
| 4 | 4 | 0 | 0 | 0 | 0 | 08 |

| STORE1 632 | STORE2 634 | STORE3 636 | LOOP BEGIN 638 | LOOP END 640 | REPEAT 642 | ATTN 644 |
|---|---|---|---|---|---|---|
| 1F | 1F | 1F | 01 | 00 | 0 | 0 |
| 1F | 1F | 1F | 02 | 00 | 0 | 0 |
| 1F | 1F | 1F | 00 | 00 | 0 | 0 |
| 1F | 18 | 1F | 00 | 03 | 1 | 0 |

PROGRAMMABLE PATTERN GENERATOR

BACKGROUND OF THE INVENTION

1. Field of the Invention

This invention relates generally to programmable logic devices and more particularly to a programmable pattern generator adapted for testing memory devices.

2. Description of the Related Art

Testing systems have been developed for determining the proper functioning of semiconductor devices, such as memory devices. The testing system typically writes a number of data patterns simultaneously to a group of memory devices under test. Memory devices often have multiple banks of memory which may be grouped into blocks and sub-blocks. The internal organization of the memory device is such that sequential addresses do not necessarily indicate adjacent locations. Also, due to the manner in which cells in a memory device are typically designed, a logic "1" on an external data line may actually be stored as a logic "0" in a given cell.

The particular internal organization of the memory device as related to the location of sequential address is referred to as its address topology, and the organization of the memory device with respect to the way data is stored is referred to as its data topology. Different memory device models typically have different address and data topologies, depending on their specific layout, size, etc.

To ensure that a test is performed as intended, the testing system must account for both the address topology and the data topology while performing the test. Various data patterns used for testing a memory device are well known in the art. For example, a checkerboard data pattern involves writing alternating logic "1" and logic "0" values in a block of cells. To ensure that the block of cells is contiguous, the testing system considers the address topology when deciding the particular cells to access. Also, the testing system considers the data topology when determining whether to write a logic "1" or a logic "0" to a particular cell to achieve the desired checkerboard pattern. Address and data topologies are typically defined by logic functions having exclusive OR, AND, and/or OR components. The logic functions are performed on the row and/or column address to account for the particular topologies.

Generally, program loops are used to implement the testing patterns used to perform a particular test. Typically, a number of instructions are used to control the looping. For example, a comparison is conducted to determine if a loop terminating condition is met at the end of the loop. If the loop terminating condition is not met the program is instructed to branch back to the starting point, and if the loop terminating condition is met, the program branches to the next instruction. This plurality of steps to control a loop adds overhead clock cycles (i.e., no testing of the device is being performed during these instructions). The number of overhead clock cycles is significant due to the number of loops typically used to complete a testing pattern. Due to the overhead, the time required to complete a test pattern using a program loop is increased.

Prior testing systems have typically used cross bar switches to manipulate a particular row or column address received from an address generator and access lookup tables based on the manipulated address. A cross bar switch typically has the same number of inputs and outputs and allows any of the inputs to be routed to any of the outputs. For example, the third input may be routed to the tenth output. In effect, a cross bar switch allows an address to be rearranged in a predetermined fashion. A cross bar switch performs no logic operations, however, the lookup tables are programmed based on the address and data topologies of the memory device to provide outputs based on logical combinations of the inputs.

Cross bar switches typically consume large amounts of circuit area and are not easily integrated with other components of the testing system, resulting in more complicated and costly circuits.

The present invention is directed to overcoming, or at least reducing the effects of, one or more of the problems set forth above.

SUMMARY OF THE INVENTION

One aspect of the present invention is seen in a pattern generator including an address generator, an address topology generator, and a data topology generator. The address generator is adapted to provide a first address having a plurality of address bits. The address topology generator includes a first plurality of exclusive OR logic gates. Each exclusive OR logic gate of the first plurality is coupled to receive at least a subset of the plurality of address bits. The first plurality of exclusive OR logic gates generate a second address having a plurality of modified address bits. The data topology generator is adapted to receive at least a subset of the plurality of modified address bits and generate write data based on the subset of modified address bits.

Another aspect of the present invention is seen in a method for generating a pattern. The method includes generating a first address having a plurality of address bits. A second address having a plurality of modified address bits is generated. The second address is an exclusive OR combination of subsets of the address bits. Write data is generated based on a subset of the modified address bits.

BRIEF DESCRIPTION OF THE DRAWINGS

The invention may be best understood by reference to the following description taken in conjunction with the accompanying drawings, in which like reference numerals identify like elements, and in which:

FIG. 8 provides exemplary microinstructions for illustrating the operation of the algorithmic pattern generator of FIG. 2.

Figure 1:
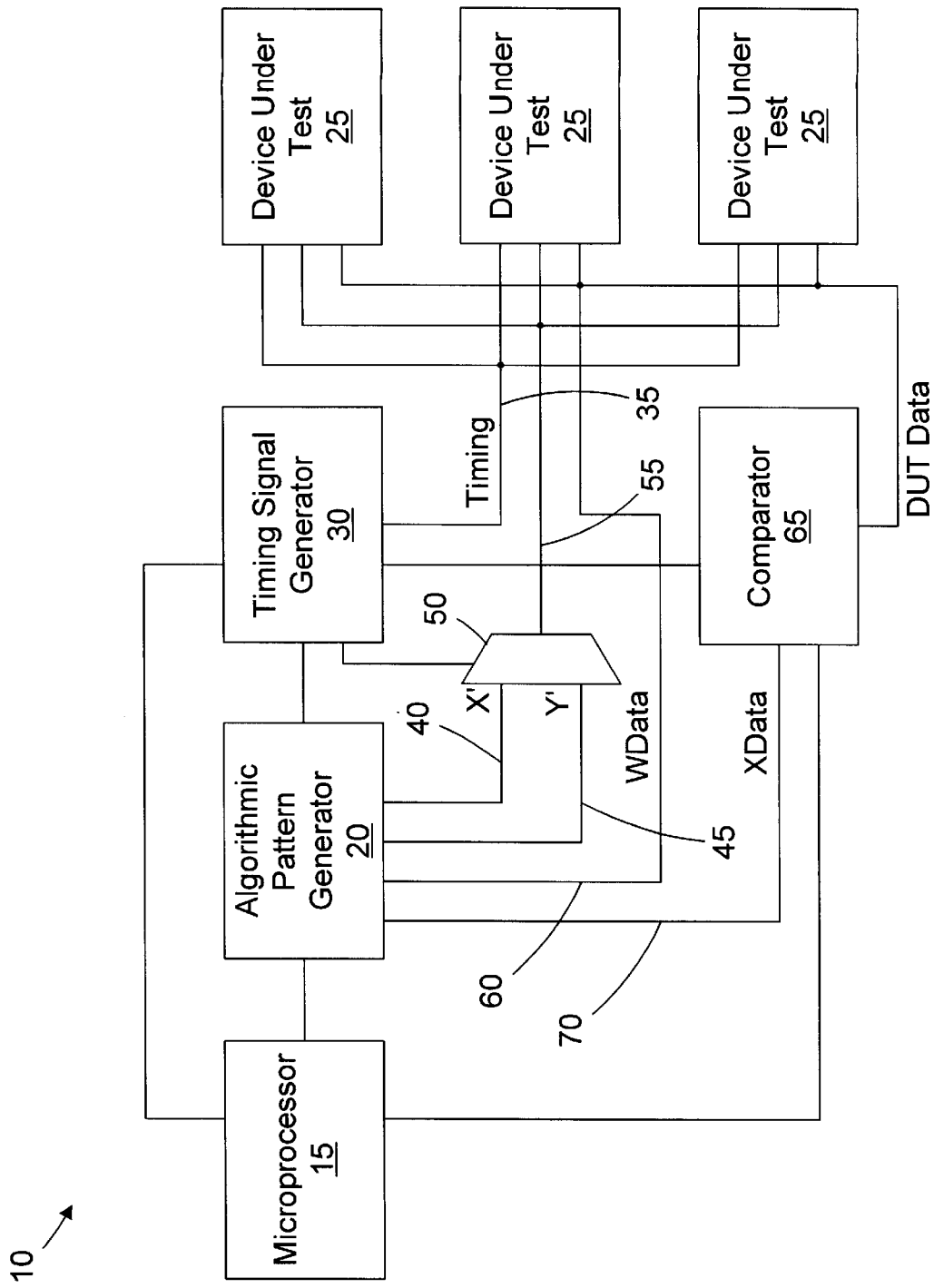
FIG. 1 is a simplified block diagram of a testing system in accordance with the present invention.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Referring now to FIG. 1, a simplified block diagram of a testing system 10 is provided. The testing system 10 includes a microprocessor 15 for controlling the overall operation of the testing system 10. An algorithmic pattern generator 20 is responsible for providing address and data signals for accessing a plurality of devices under test 25 (DUTs). In the illustrated embodiment, three DUTs 25 are being tested simultaneously. In an actual implementation, the testing system 10 may simultaneously test hundreds of the DUTs 25. A timing signal generator cooperates with the algorithmic pattern generator 20 and provides timing signals on a timing line 35 for accessing the DUTs 25. The particular timing signals depend, in part, on the type of device being tested. For example, if the DUT 25 is a synchronous dynamic access memory (SDRAM), the timing signals would typically include a clock signal (CLK), a row address select signal (RAS#), a column address select signal (CAS#), and a write enable signal (WE#). The timing line 35 may include a plurality of individual lines (not shown) depending on the number of timing signals desired. The discussion of timing signals compatible with an SDRAM is for illustrative purposes only. It is contemplated that in light of the description herein, the testing system 10 may be adapted to test other types of devices requiring other timing signals.

The algorithmic pattern generator 20 provides a row address (X') on a row line 40 and a column address (Y') on a column line 45 to a multiplexer 50. The timing signal generator 30 controls the multiplexer 50 depending on the particular command being issued to the DUTs 25. For example, a memory device, such as the DUT 25, is typically accessed by supplying an active command coincident with a row address to open a particular row in the device. Subsequently, a read or write command is issued coincident with a column address to specify the particular selected column or row address to the DUTs 25 on an address line 55. The row line 40 and the column line 45 may each include a plurality of individual lines (not shown) corresponding to the number of bits in the respective row or column address. The algorithmic pattern generator 20 also provides write data (WData) on a data line 60 to the DUTs 25.

After a particular pattern is stored in the DUTs 25, they are accessed to read the data and verify that the pattern was stored properly. The data read from the DUTs 25 is provided on the data line 60 to a comparator 65. The algorithmic pattern generator 20 provides expected data (XData) to the comparator 65 on an expected data line 70. In an actual implementation, the comparator 65 includes a plurality of individual comparators (not shown), each receiving the data read from a particular DUT 25 and comparing the read data to the expected data provided by the algorithmic pattern generator 20. The results of the comparison performed by the comparator 65, referred to as test indicators, are provided to the microprocessor 15. The microprocessor 15 evaluates the output of the comparator 65 to determine those DUTs 25, if any, that have failed the test.

Figure 2:
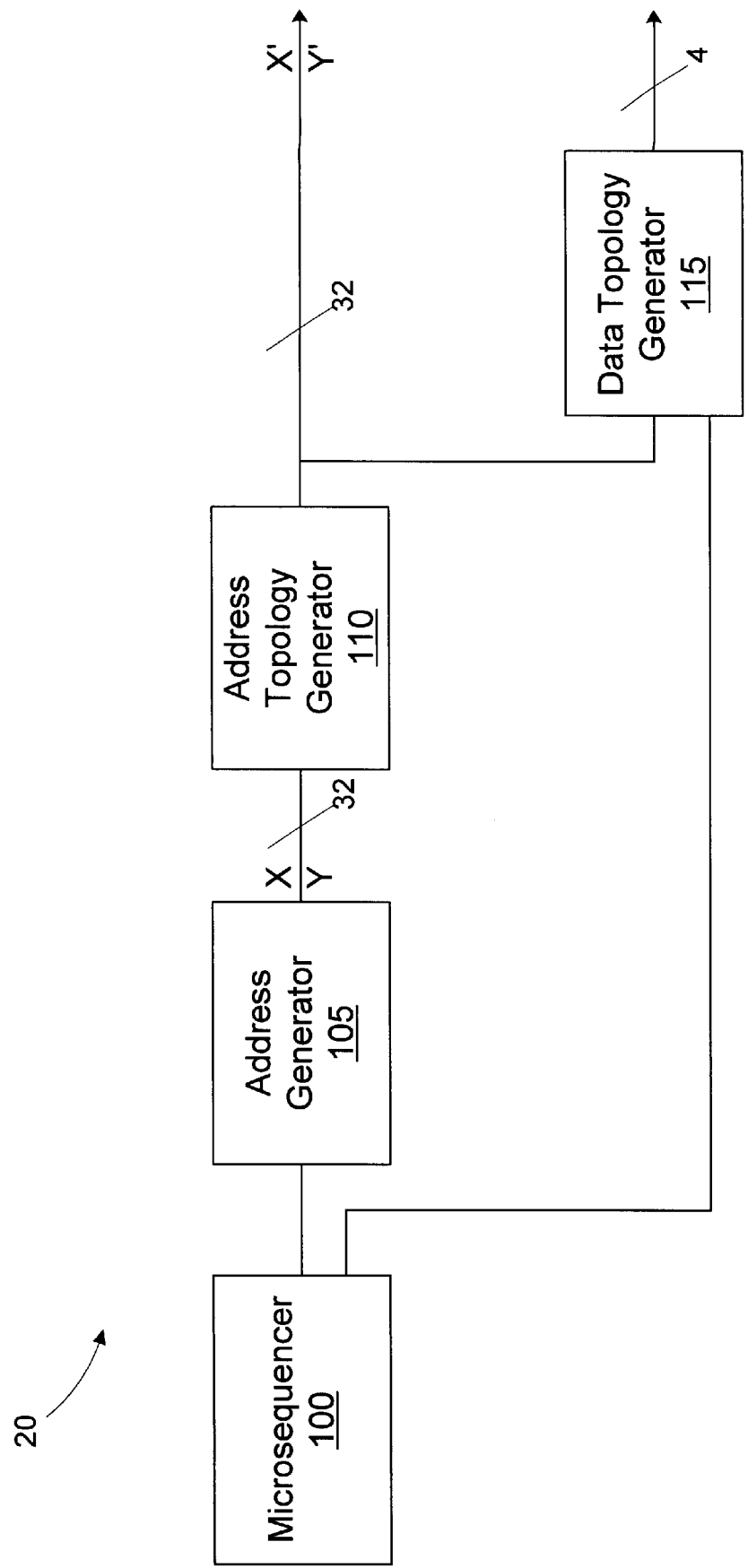
FIG. 2 is a simplified block diagram of an algorithmic pattern generator in the testing system of FIG. 1.

Turning to FIG. 2, a simplified block diagram of the algorithmic pattern generator 20 is provided. The algorithmic pattern generator 20 includes a microsequencer 100 for storing and issuing commands that control the operation of the algorithmic pattern generator 20. An address generator 105 receives commands from the microsequencer 100, and generates an X address (16 bits) and a Y address (16 bits) based on the commands. The address lines (32 bits total) are received by an address topology generator 110 programmed in accordance with the address topology of the DUT 25 to provide modified addresses X' and Y'. The output of the address topology generator 110 is provided to the multiplexer 50 shown in FIG. 1. The first sixteen bits represent the X' address on the row line 40 and the second sixteen bits represent the Y' address on the column line 45. The number of bits in the address may vary depending on the specific design of the DUT 25.

The output of the address topology generator 110 is also provided to a data topology generator 115 programmed in accordance with the data topology of the DUT 25. The data topology generator 115 provides write data (WData) to be written to the DUTs 25 and expected data (XData) to be provided to the comparator 65 for verification.

Figure 3:
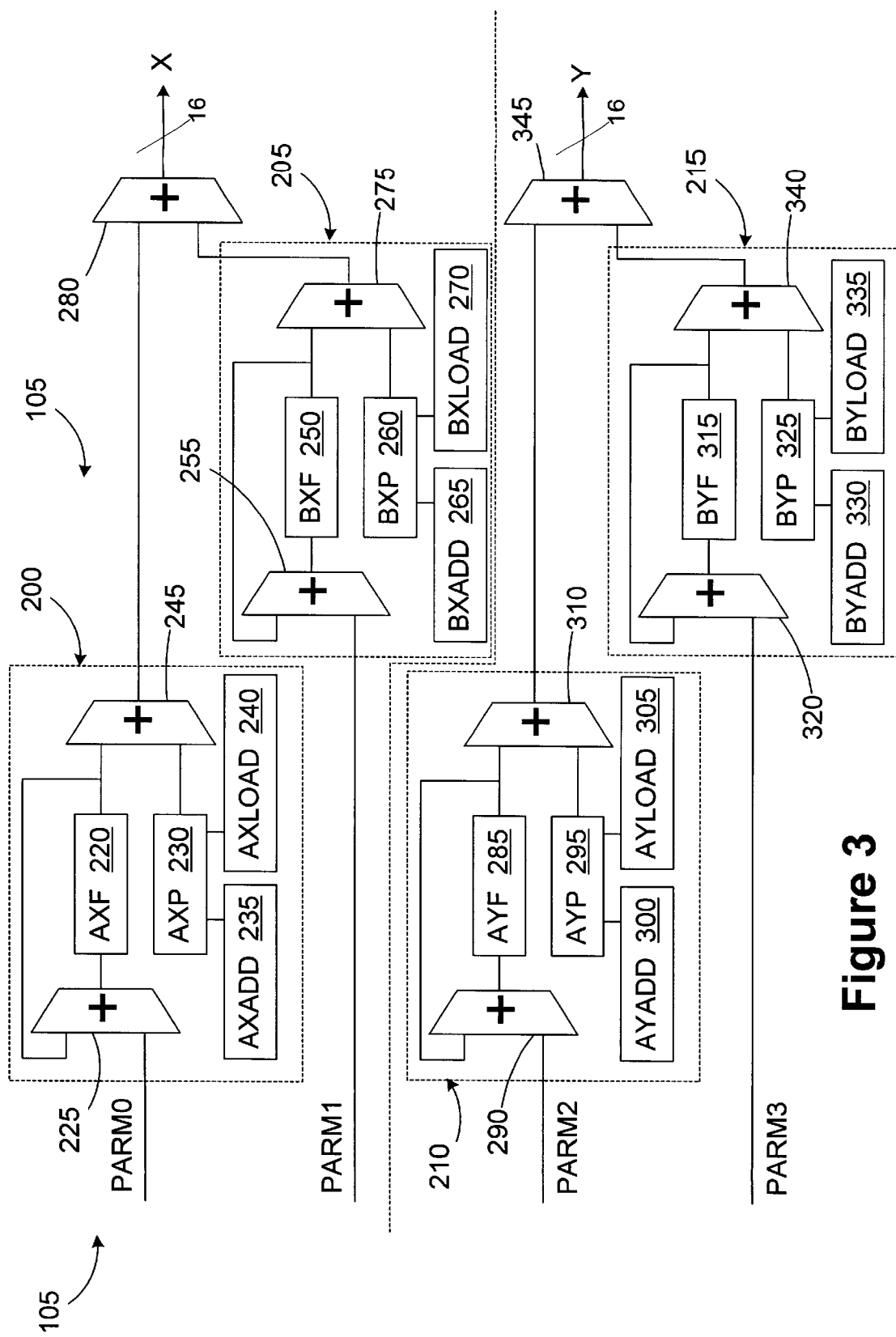
FIG. 3 is a simplified block diagram of an address generator in the algorithmic pattern generator of FIG. 2.

FIG. 3 illustrates a simplified block diagram of the address generator 105. The address generator 105 receives commands from the microsequencer 100 for loading and incrementing the X and Y addresses. The specific makeup of a command from the microsequencer 100 is described in greater detail below in reference to FIG. 6. The address generator 105 includes four register blocks 200, 205, 210, 215. Two of the register blocks 200, 205 are associated with the generation of the X address and two of the register blocks 210, 215 are associated with the generation of the Y address. In the illustrated embodiment, each of the register blocks 200, 205, 210, 215 has the same functionality, although it is contemplated that more or less functionality may be provided for the register blocks 200, 205, 210, 215 depending on the specific requirements of the algorithmic pattern generator 20.

The register block 200 includes an AXF register 220. An adder/multiplexer 225 receives a parameter (PARM0) 602 (described below in reference to FIG. 6) from the microsequencer 100 and the current value of the AXF register 220 (the operation of microsequencer is described in greater detail below in reference to FIGS. 6, 7, and 8). As used herein, the term adder/multiplexer refers to a device that provides an output by either selecting one of its inputs or adding its inputs together. In an actual implementation, the adder/multiplexer 255 includes an arrangement of discrete multiplexers (not shown) and adders that are controlled to provide the selecting or adding functionality. On each clock cycle, the microsequencer 100 may issue a command that sets the AXF register 220 to a constant value, holds the value, or adds to or subtracts from the value (i.e., subtraction is performed by adding the one's compliment of the value to be subtracted).

The register block 200 also includes an AXP register 230, an AXADD register 235, and an AXLOAD register 240. On each clock cycle the value stored in the AXP register 230 may be changed by adding the value stored in the AXADD register 235 or by setting the value to the constant value stored in the AXLOAD register 240. Again, subtraction may be performed by loading the AXADD register 235 with a one's compliment number. The AXP register 230 is controlled by hardware looping information contained within the commands issued by the microsequencer 100. The AXF register 220 and the AXP register 230 are coupled to an adder/multiplexer 245, which either selects one of the AXF register 220 value and the AXP register 230, or adds the values together.

The register block 205 includes an BXF register 250, an adder/multiplexer 255 that receives a parameter 604 (PARM1), an BXP register 260, an BXADD register 265, and an BXLOAD register 270 that are controlled in similar manner as described above for the register block 200. An adder/multiplexer 275 receives the values stored in the BXF register 250 and the BXP register 260. The outputs of the register block 200 and the register block 205 are received by an adder/multiplexer 280, which either adds them together or selects one of them to generate the X address.

The register block 210 includes a AYF register 285, an adder/multiplexer 290 that receives a parameter 606 (PARM2), a AYP register 295, a AYADD register 300, and a AYLOAD register 305 that are controlled in similar manner as described above for the register block 200. An adder/multiplexer 310 receives the values stored in the AYF register 285 and the AYP register 295.

The register block 215 includes a BYF register 315, an adder/multiplexer 320 that receives a parameter 608 (PARM3), a BYP register 325, a BYADD register 330, and a BYLOAD register 335 that are controlled in similar manner as described above for the register block 200. An adder/multiplexer 340 receives the values stored in the BYF register 315 and the BYP register 325. The outputs of the register block 210 and the register block 215 are received by an adder/multiplexer 345, which either adds them together or selects one of them to generate the Y address.

As described in greater detail below, the microsequencer 100 issues commands to the address generator 105 to produce X and Y addresses for accessing the DUTs 25. The register blocks 200, 205, 210, 215 provide great flexibility for providing and incrementing the addresses to generate the desired address pattern.

Figure 4A:
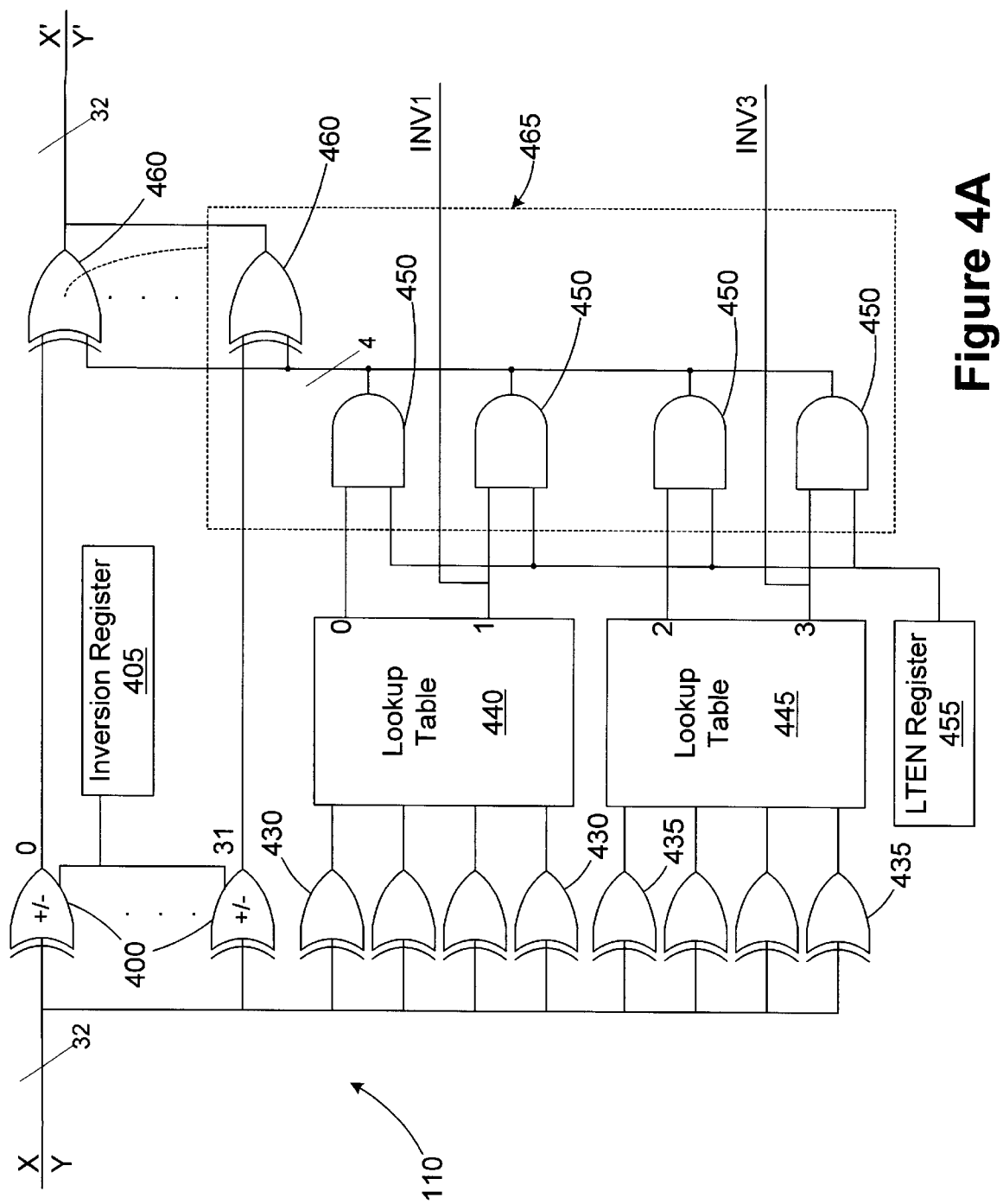
FIG. 4A is a simplified block diagram of an address topology generator in the algorithmic pattern generator of FIG. 2.

FIG. 4A illustrates a simplified block diagram of the address topology generator 110. The address data generated by the address generator 105 is received by the address topology generator 110. As indicated above, sixteen bits represent the X address and sixteen bits represent the Y address. The address topology generator 110 performs logic operation on the X and Y addresses in accordance with the address topology of the particular DUT 25 being tested. The thirty-two bits from the address generator 105 are provided to an array of thirty-two exclusive OR (XOR) gates 400.

The XOR gates 400 allow any of the address generator bits to be XORed with any of the other address bits. The thirty-two inputs to the XOR gate 400 are selectable, and also, the output of the XOR gate 400 may be inverted by a control signal. Inversion control is provided by a thirty-two bit inversion register 405 that designates those XOR gates to be inverted.

Figure 4B:
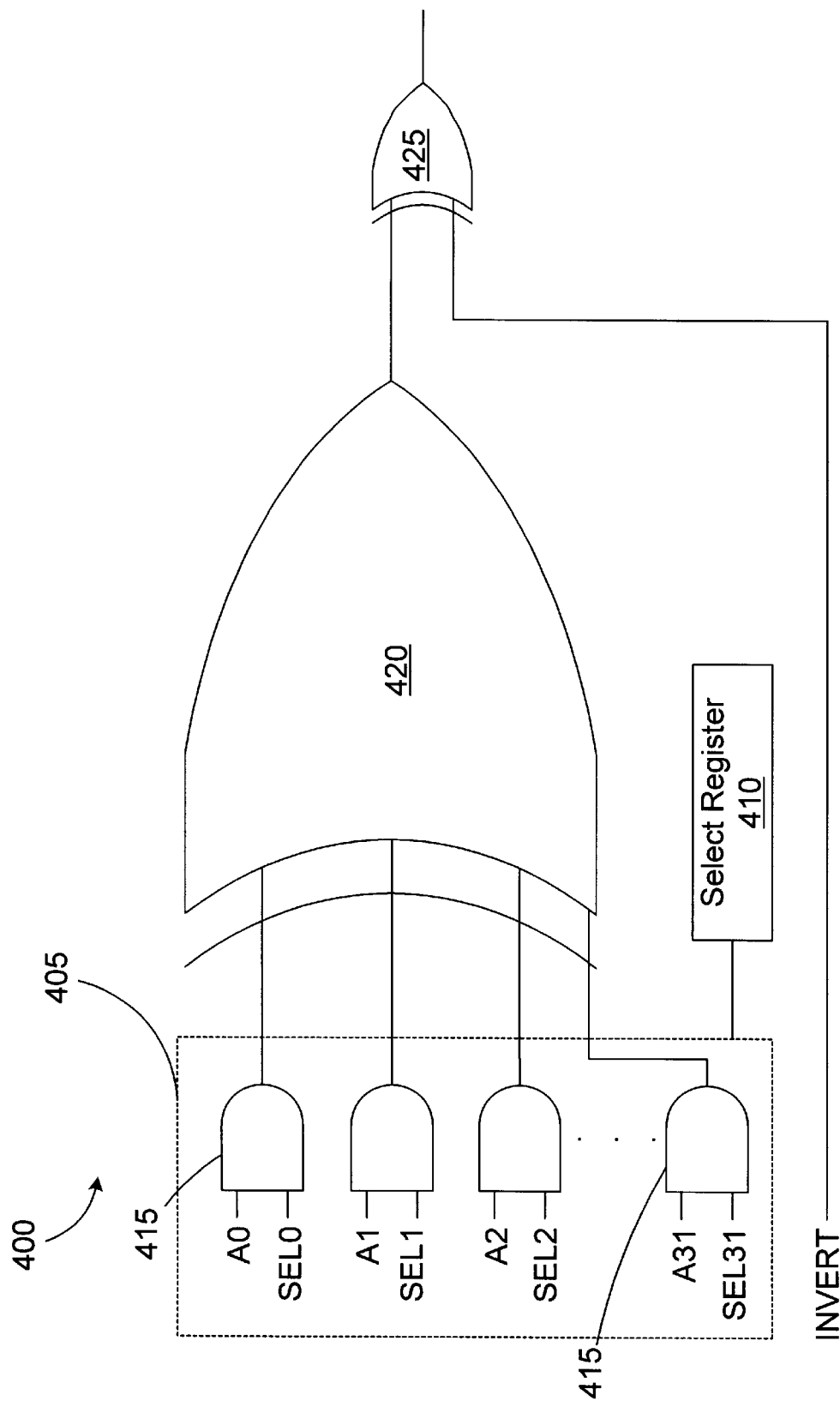
FIG. 4B is a simplified block diagram of an exclusive OR circuit including inversion control and input masking in the algorithmic pattern generator of FIG. 2.

Turning briefly to FIG. 4B, a more detailed block diagram of the XOR gate 400 is provided. The XOR gate 400 includes a select circuit 405. A select register 410 provides thirty-two select bits, SELx, to the select circuit 405 for determining those address generator outputs, Ax, to be logically combined. The Ax and SELx signals are provided to AND gates 415. The AND gates 415 effectively pass the AX signals to be XORed and mask out the remaining Ax signals. The outputs from the select circuit 410 are combined in an XOR gate 420. The XOR gate 420 is illustrated as a single thirty-two input gate, however, in an actual implementation, the XOR gate 420 may comprises a series of cascaded XOR gates (not shown) having fewer inputs (e.g., 2) that collectively perform a thirty-two bit XOR function.

The output of the XOR gate 420 is received by an XOR gate 425. The XOR gate 425 also receives an inversion bit from the inversion register 405 (shown in FIG. 4A) corresponding to the XOR gate 400. The XOR gate 425 inverts the output of the XOR gate 420 is a logic "1" is received from the inversion register 405. Each of the XOR gates 400 in FIG. 4A has its own select circuit 405 and corresponding select register 410. As is well known in the art, the functionality of the XOR gate 400 may be provided using other equivalent logic operations (i.e., through DeMorgan transformation).

Returning now to FIG. 4A, the thirty-two bits from the address generator 105 are also provided to an array of eight XOR gates 430, 435. The XOR gates 430, 435 include select circuits (not shown) and corresponding select registers (not shown) for selecting subsets of the thirty-two bits from the address generator 105 to be logically combined, similar to those described above in reference to the XOR gate 400 of FIG. 4B. However, the XOR gates 430, 435 do not include inversion control.

The outputs of the four XOR gates 430 are used to access a first address topology lookup table 440, and the outputs of the four XOR gates 435 are used to access a second address topology lookup table 445. The lookup tables 440, 445 each provide two outputs (i.e., arranged as 16×2). The lookup tables 440, 445 may be programmed to provide a non-XOR logic function, such as an AND operation or an OR operation on the address generator outputs. The outputs of the lookup tables 440, 445 are provided to AND gates 450. As described in greater detail below, two of the lookup table 440, 445 outputs, designated by the INV1 and INV3 signals, are passed to the data topology generator 115.

Each of the AND gates 450 also receives an enable input from a lookup table enable (LTEN) register 455. The outputs of the AND gates 450 are provided to an XOR gate 460. The XOR gate 460 also receives the output from one of the XOR gates 400. The value stored in the LTEN register 455 determines the lookup table 440, 445 outputs that are passed to the XOR gate 460. Collectively, the AND gates 450, LTEN register 455, and XOR gate 460 define a lookup table masking circuit 465. Each of the thirty-two XOR gates 400 has an associated lookup table masking circuit 465. The enabled lookup table 440, 445 outputs are XORed with the outputs of the XOR gates 400 to generate X' and Y' addresses modified in accordance with the address topology of the DUT 25.

Figure 5:
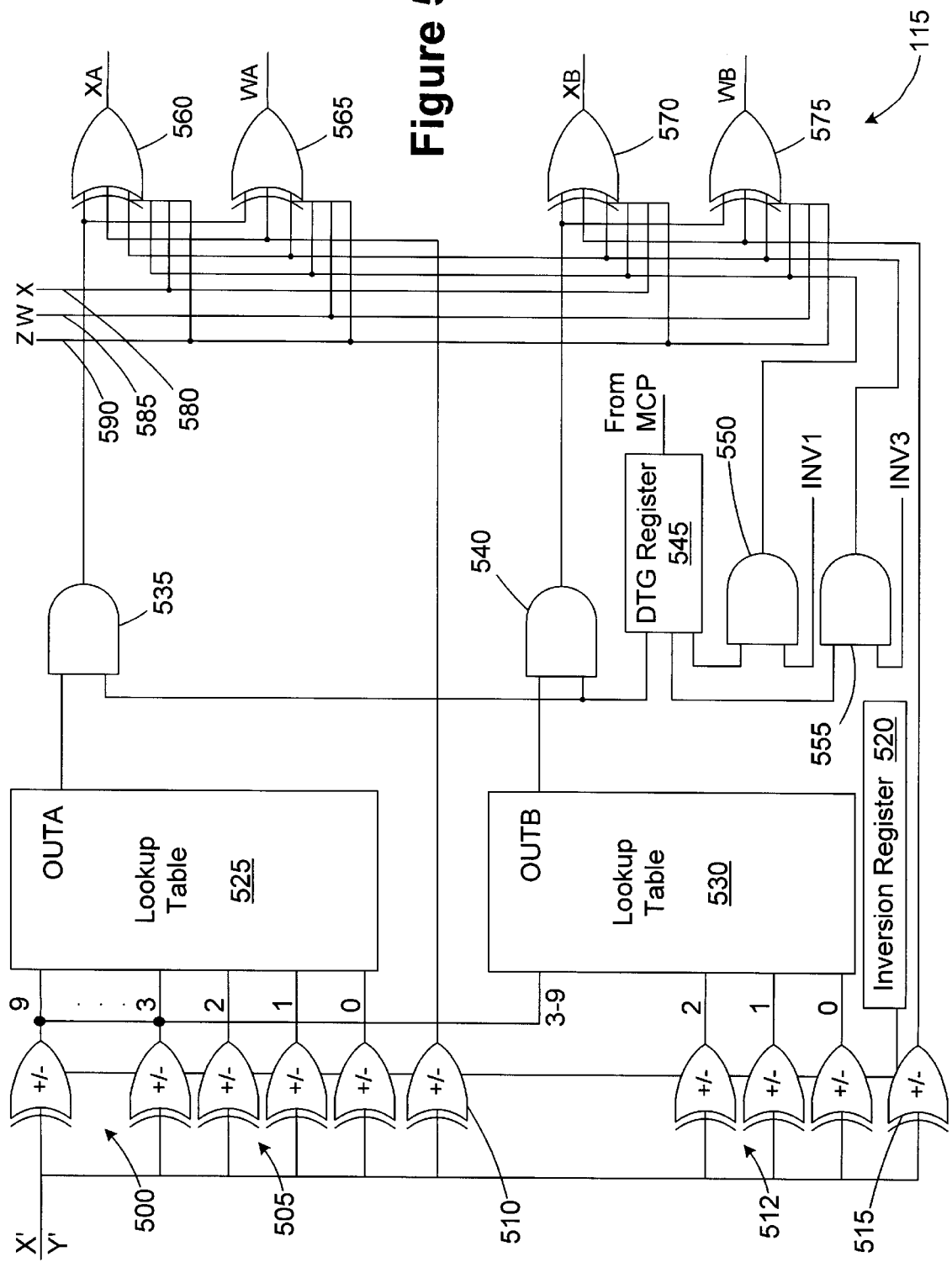
FIG. 5 is a simplified block diagram of a data topology generator in the algorithmic pattern generator of FIG. 2.

FIG. 5 illustrates a simplified block diagram of the data topology generator 115. The outputs of the address topology generator 110 (i.e., X' and Y') are received in XOR gates 500, 505, 510, 512, 515 having select and inversion control similar to the XOR gate 400 of FIG. 4A. An inversion register 520 provides signals to the XOR gates 500 through 515 for inverting the outputs of designated XOR gates 500 through 515. Each of the XOR gates 500 through 515 also has an associated select register 410 for passing or masking bits of the X' and Y' addresses.

The outputs of the XOR gates 500, 505 are used to address a first data topology lookup table 525, and the outputs of the XOR gates 500, 512 are used to address a second data topology lookup table 530. The lookup tables 525, 530 are arranged as 1024×1, however, they are addressed by the microprocessor 15 as 64×16 as data is being written to them. The XOR gates 500 (bits 3–9) are common to both lookup tables 425, 430. The XOR gates 505, 512 (bits 0–2) independently address the lookup tables 425, 430. The lookup tables 425, 430 are programmed in accordance with the data topology of the DUT 25. The actual number of XOR gates 500, 505, 512 used to address the lookup tables 525, 530 may vary depending on the size of the lookup tables 525, 530 and the complexity of the data topology. The outputs of the XOR gates 510, 515 bypass the lookup tables 425, 430.

The outputs of the lookup tables (OUTA and OUTB) 525, 530 are coupled to AND gates 535, 540. The AND gates also receive enable signals from a data topology generator (DTG) control register 545. The DTG register 545 is set by the microprocessor 15 to configure the data topology generator 115. The INV1 and INV3 signals from the address topology generator 110 are received by AND gates 550, 555. The AND gates 550, 555 are also coupled to the DTG register 545 for selectively enabling or masking the INV1 and INV3 signals.

XOR gates 560, 565 provide one set of expected data and write data (XA and WA) signals, and XOR gates 570, 575 provide a second set of expected data and write data (XB and WB) signals. Collectively, the WA and WB signals define the WData signal (shown in FIG. 1) that is provided to the DUTs 25. Likewise, the XA and XB signals define the XData signal (shown in FIG. 1) that is provided to the comparator 65. The XA, XB, WA, and WB signals may be routed to the DUTs 25 in any combination. For example, a first group of data lines in a DUT 25 having a first topology might receive the WA signal, and a second group of data lines in the DUT 25 having a different topology might receive the WB signal. The corresponding XA and WA signals are routed to the appropriate comparator 65.

An X signal, a W signal, and a Z signal are received from the microsequencer 100 on lines 580, 585, and 590, respectively. The values for the X, W, and Z signal are contained within the command issued by the microsequencer 100, as described in greater detail below. The line 580 carrying the X signal is coupled to the expected data XOR gates 560, 570 for inverting the expected data outputs. The line 585 carrying the W signal is coupled to the write data XOR gates 565, 575 for inverting the write data outputs. The line 590 carrying the Z signal is coupled to the expected data and the write data XOR gates 560, 565, 570, 575 for inverting the both the expected data outputs and the write data outputs. The DTG register 545 may also selectively enable the X, W, and Z signals through additional logic (not shown).

The XOR gates 560, 565 (i.e., associated with XA and WA) also receive the lookup table 525 output from the AND gate 535, the bypass output from the XOR gate 510, the INV1 signal from the AND gate 550, and the INV3 input from the AND gate 555. The XOR gates 570, 575 (i.e., associated with XB and WB) receive the lookup table 530 output from the AND gate 540, the bypass output from the XOR gate 515, the INV1 signal from the AND gate 550, and the INV3 input from the AND gate 555.

The outputs of the XOR gates 560, 565, 570, 575 may receive inversion signals from different sources that combine to cancel out the inversion. For example, the XOR gate 560 might receive an inversion signal from the AND gate 550 (i.e., based on the INV1 signal) and an inversion signal on the line 580 (i.e., based on the X signal). The two inversion signal would cancel each other and the output of the XOR gate 560 would simply be the value from the lookup table 525 through the AND gate 535 (i.e., assuming no other inversion inputs are received and the AND gate 535 is enabled by the DTG register 545).

Figure 6:
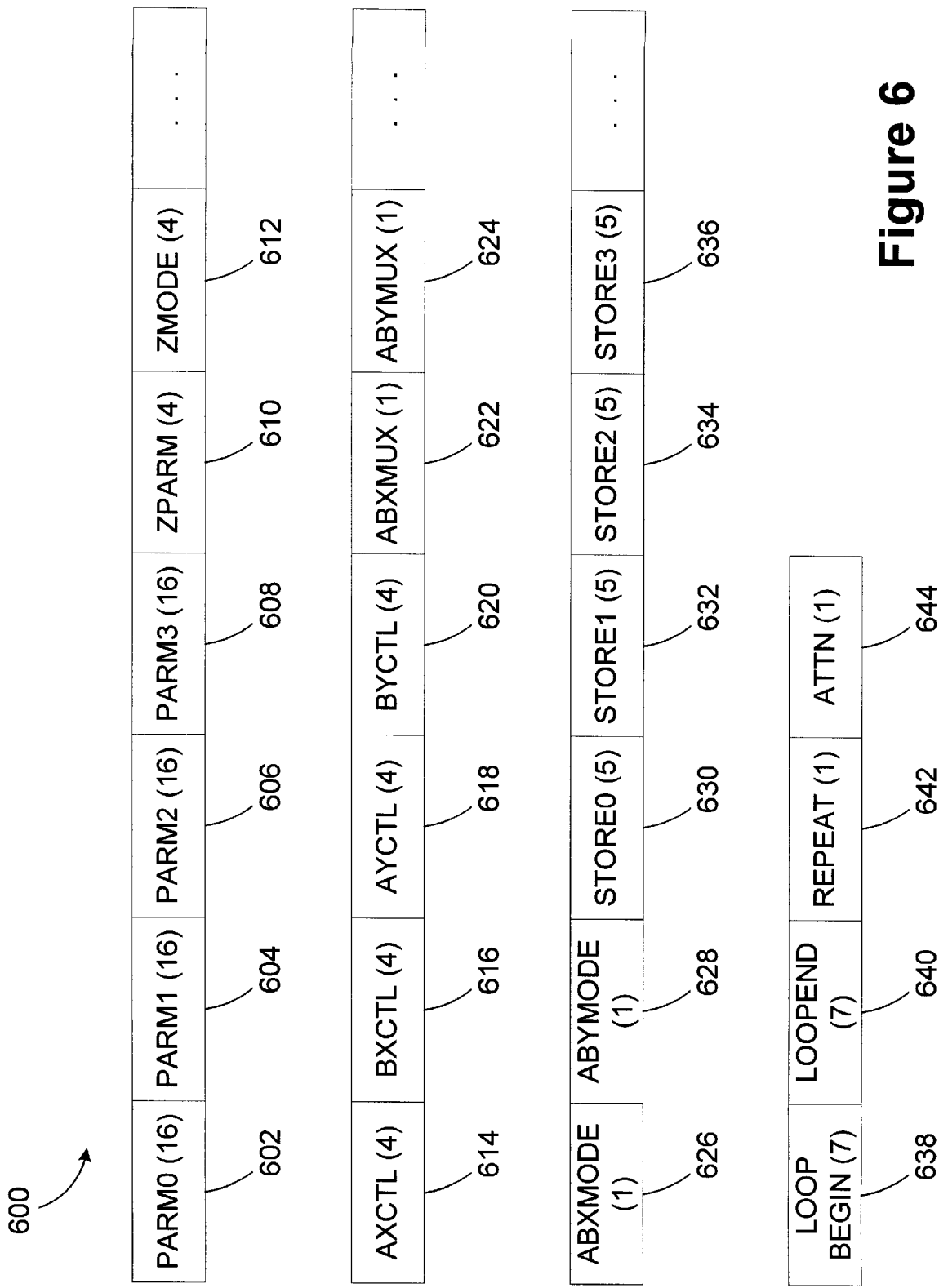
FIG. 6 is a simplified diagram illustrating the partitioning of a command issued by a microsequencer in the algorithmic pattern generator of FIG. 2.

FIG. 6 illustrates the partitioning of a command, or microinstruction 600, issued by the microsequencer 100 to control the operation of the algorithmic pattern generator 20. The microprocessor 15 provides inputs to the algorithmic pattern generator 20, but the microsequencer 100 stores the microinstructions 600 that are used to perform a given test. In the illustrated embodiment, the microsequencer 100 is capable of storing sixty-four, 128-bit microinstructions 600 indexed by a program counter (not shown). The microsequencer 100 is capable of performing hardware looping without requiring additional overhead (i.e., zero cycle branching). In the illustrated embodiment, instructions containing loops may be nested seven levels deep, however, more or less loop levels are contemplated.

The microinstruction 600 includes four 16-bit general parameters (PARM0 to PARM3) 602, 604, 606, 608. The general parameters 602, 604, 606, 608 contain data to be written to one of the registers in the algorithmic pattern generator 20. A 4-bit Z parameter (ZPARM) 610 is used to specify the values for a set of for Z-bits (not shown) used for various purposes in the testing system 10. In the algorithmic pattern generator 20, the Z-bits (not shown) may be used to selectively invert the outputs of the WData and XData XOR gates 560, 565, 570, 575 (shown in FIG. 5). If Z-bit0 is set, the expected data signal is inverted (i.e., by asserting the X signal). If Z-bit1 is set the write data signal is inverted (i.e., by asserting the W signal). If either of Z-bit3 and Z-bit4 is set, both the expected and write data signals are inverted (i.e., by asserting the Z signal). A 4-bit Z mode parameter (ZMODE) 612 determines if the Z-bits (not shown) are loaded with the values specified by the ZPARM parameter 610 or toggled based on the values specified in the ZPARM parameter 610 (i.e., "1" indicates toggle, "0" indicates hold).

The microinstruction 600 further includes 4-bit control parameters (AXCTL, BXCTL, AYCTL, BYCTL) 614, 616, 618, 620 for controlling the register blocks 200, 205, 210, 220, respectively (shown in FIG. 3). The format of the AXCTL control parameter 614 operates as follows. If bit 3 is set, X=AXP 230, else X=AXF 220. If bit 0 is set, AXF 220=AXP 230. If bit 1 is set, AXF 220 =PARMO 602. If bit 2 is set, AXF 220 =AXF 220. If more than one of bits 0, 1, and 2 are set, AXF 220 is a sum. For example, if bits 0, 1, and 2 are set, AXF 220=AXP 230+PARMO 602+AXF 220. If none of bits 0, 1, and 2 are set, AXF 220=0. The BXCTL, AYCTL, and BYCTL control parameters 616, 618, 620 have essentially the same format, with the exception of the parameter field (PARM1 to PARM3) 604, 606, 608 associated with each.

A group of 1-bit multiplex parameters (ABXMUX, ABYMUX) 622, 624 control the adder/multiplexers 280, 345, respectively. The adder/multiplexer 280 selects one of the register blocks 200, 205 based on the ABXMUX parameter 622, and likewise, the adder/multiplexer 345 selects one of the register blocks 210, 215 based on the ABYMUX parameter 624. Two 1-bit mode parameters (ABXMODE, ABYMODE) 626, 628 control the adder/multiplexers 280, 345 by indicating whether to select an independent input (i.e., based on the control block 200, 205, 210, 215 selected by the ABXMUX and ABYMUX parameters 622, 624) or to add the inputs.

Four 5-bit storage location parameters (STORE0, to STORE3) 630, 632, 634, 636 indicate the destinations (e.g., AXF, AXP, AXADD, AXLOAD, loop count registers, repeat counters, etc.) for the general parameters, PARM0 to PARM3 602, 604, 606, 608. A 7-bit loop begin parameter (LOOPBEGIN) 638 designates that a loop is to be initiated. The seven bits correspond to the seven possible nested loop levels. A 7-bit loop end parameter (LOOPEND) 640 designates that a loop is to be ended. Again, the seven bits correspond to the seven possible nested loop levels.

A 1-bit repeat parameter (REPEAT) 642 designates that the microinstruction 600 is to be repeated. A repeat count register 815 (described below in reference to FIG. 8) tracks the number of times the microinstruction 600 is to be repeated. A 1-bit attention parameter (ATTN) 644 pauses the microsequencer 100. The ATTN parameter 644 may be used to interrupt the microprocessor 15.

Figure 7:
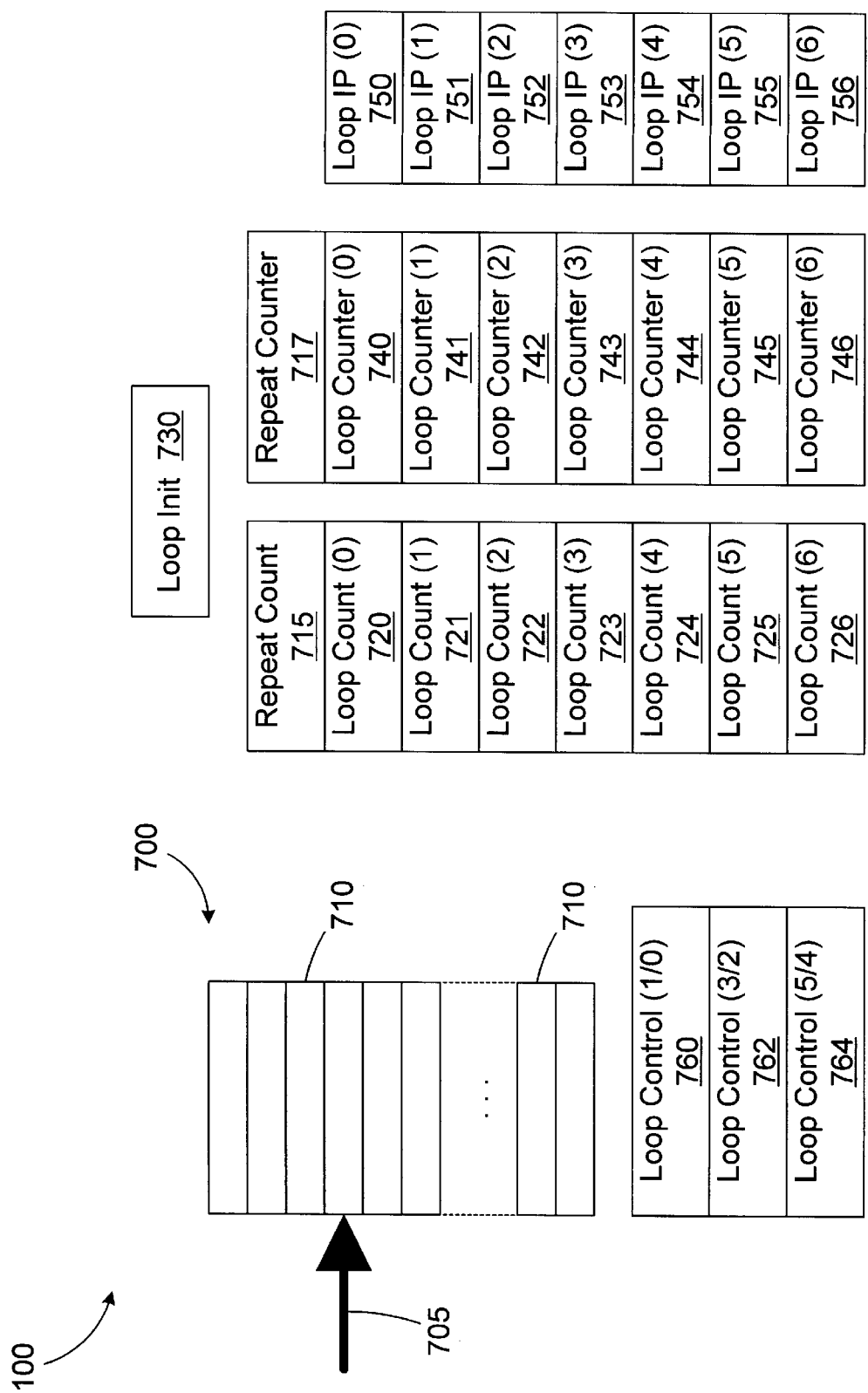
FIG. 7 is a simplified block diagram of the microsequencer of FIG. 2.

Turning now to FIG. 7, a simplified block diagram of the microsequencer 100 is provided. The microsequencer 100 is able to perform zero-overhead looping (i.e., no separate branch instructions are required to implement program loops). The microsequencer 100 includes an instruction queue 700 for storing the microinstructions 600. The instruction queue 700 is indexed through an instruction pointer 705. In the illustrated embodiment, the instruction queue 700 includes 64, 128-bit entries 710.

The microsequencer 100 includes a repeat count register 715 and a corresponding repeat counter 717. A microinstruction 600 having the repeat bit 642 set is repeated the number of times specified in the repeat count register 715, which may be loaded by a previous microinstruction or during initialization. The repeat counter 717 tracks the number of times the microinstruction 600 has been repeated.

Seven loop count registers 720, 721, 722, 723, 724, 725, 726, corresponding to seven levels of loop nesting, are provided. A loop initialization register 730 stores data indicating if a particular loop has been entered for the first time. Loop counters 740, 741, 742, 743, 744, 745, 746 track the number of times a loop has yet to be repeated. Loop instruction pointer (loop IP) registers 750. 751, 752, 753, 754, 755, 756 are provided for storing the instruction pointer associated with the start of a loop. The looping mechanism of the microsequencer 100 is illustrated through the following examples.

The microinstruction 600 includes information to specify the nested loops. In the first microinstruction 600 of a loop, the loop begin field 638 includes a bit set corresponding to the hierarchical nesting level of the loop (i.e., level 0 is the outermost loop level and level 6 is the innermost loop level). The last microinstruction 600 of a loop has a bit set in the loop end field 640 corresponding to the loop level. The loop begin field 638 and the loop end field 640 each may have multiple bits set (i.e., the microinstruction 600 may be the first or last statement in more than one loop.

Loop control registers 760, 762, 764 store information related to actions to take at the end of a particular loop. Each loop control register 760, 762, 764 contains information for two loop levels. For example, the first loop control register 760 controls loop levels 0 and 1, the second loop control register 762 controls loop levels 2 and 3, and the third loop control register 764 controls loop levels 4 and 5. In the illustrated embodiment, the add and load operations described below are only supported for levels 0 through 5. However, it is contemplated that additional support for deeper loop levels may be implemented.

The bit breakdown for control words stored in the loop control registers 760, 762, 764, 766 is as follows. The control word includes 16 bits, 8 bits (i.e., subword) for each loop level. The first four bits of the subword indicate an add event and the second four bits indicate a load event. The bit position within the subword indicates the particular register to be used. For the add events, bit 0 corresponds to the AXADD register 235 (shown in FIG. 2); bit 1 corresponds to the BXADD register 265; bit 2 corresponds to the AYADD register 300; and bit 3 corresponds to the BYADD register 330. For the load events, bit 4 corresponds to the AXLOAD register 240 (shown in FIG. 2); bit 5 corresponds to the BXLOAD register 270; bit 6 corresponds to the AYLOAD register 305; and bit 7 corresponds to the BYLOAD register 335.

For example, if the loop control register 762 for loop levels 2 and 3 is set to a binary value of "0100000 00000001", when the end of loop level 3 is reached, the value in the AYLOAD register 305 will be loaded into the AYP register 295. When the end of loop level 2 is reached, the value stored in the AXADD register 235 will be added to the value stored in the AXP register 230. The instructions for the end of the loop (ONLOOPEND) are executed on all but the last iteration of the loop.

When the microinstruction 600 having a bit set in the loop begin field 638 is encountered, the corresponding loop instruction pointer register 750 through 756 is loaded with the current value of the instruction pointer register 705, and the corresponding bit in the loop initialization register 730 is cleared. On the first time through the loop, the corresponding loop count register 720 through 726 may be set at any time before the microinstruction 600 having the corresponding bit set in the loop end field 640. Alternatively, the loop count register 720 through 726 may be set during the initialization of the algorithmic pattern generator 20, rather than during the loop, although subsequent microinstructions 600 may alter its value.

When the last microinstruction 600 of the loop is encountered on the first pass through the loop, the corresponding bit in the loop initialization register 730 is set, the corresponding loop counter 740 through 746 is set to the number of times the loop is to be repeated minus one, and the microsequencer 100 jumps to the instruction pointer 705 specified in the corresponding loop instruction pointer register 750 through 756. If more than one bits is set in the loop end field 640, the instruction pointer 705 is set to the start of the outermost loop.

On the second pass through the loop, the corresponding loop counter 740 through 746 is decremented, and any instructions to load the loop count register 720 through 726 is ignored. When the loop counter 740 through 746 reaches zero, the loop has been completed, and the instruction pointer 705 proceeds to the next microinstruction 600. Because the value in the corresponding loop count register 720 through 726 is retained, it need not be reloaded if the loop is re-entered at a later time, assuming no intervening loops at the same level are encountered. The use of the repeat bit 642 actually provides an eighth level of loop nesting when the repeated microinstruction 600 is contained in a level 7 loop.

The following exemplary source code illustrates the looping operation. The construct of four microinstructions 801, 802, 803, 804 resulting from the source code is illustrated in FIG. 8.

```
rowdecloop loop 2                              (1)
    axf = 2047, x=bx;                          (2)
    coldecloop loop 4                          (3)
        ayf = 511;                             (4)
        ayf -= 2; (i.e., ayf=ayf-2)            (5)
        repeat 254, bxf +=1; (i.e., bxf=bxf+1) (6)
    end coldecloop;                            (7)
onloopend: axp -=1;                            (8)
end rowdecloop;                                (9)
```

The first microinstruction 801 implements instructions 1 and 2 above. The second microinstruction 802 implements instructions 3 and 4. The third microinstruction 803 implements instruction 5, and the fourth microinstruction 804 implements instructions 6 through 9.

Instruction 1 marks the beginning of a loop. Accordingly, the loop begin field 638 for the first microinstruction 801 is set to 0000001b to indicate the start of a loop at level 0. The loop IP register 750 for level 0 is set to the value of the instruction pointer 705 for the first microinstruction 801. During the initialization of the microsequencer 100, the value of the loop count register 720 is set to 1. The number stored in the loop count register 720 is one less than the number of iterations in the loop, because the loop counter 740 is not decremented on the first pass through the loop. Bit 0 of the loop initialization register 730 is set to 0 indicating the first iteration.

Instruction 2 sets the value of the AXF register 220 to 2047. As a result, the PARM0 field 602 is set to 07FFh (i.e., 2047) and the AXCTL field 614 is configured to load the PARM0 field 602 into the AXF register 220 by the first microinstruction 801. Bit 3 of the AXCTL field 614 is not set and bit 1 is set, so X=AXF 220 and AXF 220=PARM0 602. The BXCTL, AYCTL, and BYCTL fields 616, 618, 620 have bit 2 set, so they hold their values (e.g., BXF 250=BXF 250).

Instruction 3 marks the beginning of another loop, so the loop begin field 638 for the second microinstruction 802 is set to 0000010b to indicate the start of a loop at level 1. The loop IP register 751 for level 1 is set to the value of the instruction pointer 705 for the second microinstruction 802. Bit 0 of the loop initialization register 730 is set to 0 indicating the first iteration. As seen in the third microinstruction 803, the loop count register 721 is loaded with 3 (i.e., the number of iterations in the loop minus 1). PARM0 602=3 and the value 11 h in the STORE0 field 630 points to the loop count register 721). The second microinstruction 802 loads the value in PARM2 606 (i.e., 1FFh=511) into the AYF register 285 based on the AYCTL field 618.

The third microinstruction 803 also implements instruction 5. The decrement value of −2 (i.e., FFFEh) is stored in the PARM2 field 606, and the AYCTL field 618 is configured such that AYF 285=AYF 285+PARM2 606.

The fourth microinstruction 804 implements instructions 6 through 9. Instruction 6 is repeated 254 times, and accordingly, the repeat count register 715 is loaded with FDh (i.e., 253) during the initialization of the APG 30. PARM1 field 604 contains a value of 1, and the BXCTL field 616 is configured to add the value in PARM1 604 to the BXF register 250. Instructions 7 and 9 mark the end of loops at levels 0 and 1, and accordingly the value in the loop end field 630 is 3. Instruction 8 is implemented by loading the loop control register (1/0) 760 with the value 00000001b. The PARM0 field 602 contains a value of −1 (i.e., FFFFh), and the value in the STORE0 field 630 corresponds to the AXADD register 235. Based on the value in loop control register (1/0) 760, the AXADD register 235 is added to the AXP register 230.

The programming of the algorithmic pattern generator 20 to accomplish various logic functions is described by the following examples. For ease of illustration, the examples are not intended to represent complete logic programming to emulate an entire address or data topology. The address and data topology are specific to the design of the particular DUT 25 being tested. It is within the capabilities of one of ordinary skill in the art to derive the proper equations pertaining to the specific design in light of the description herein. As used herein, the following nomenclature is used to represent various logic functions. A "^" designates an XOR function. A "*" designates an AND function. A "+" designates an OR function. A "!" designates a NOT function. Programming values are given in hexadecimal unless otherwise noted.

First, an example illustrating the programming of the address topology generator 110 is provided. The address topology generator 110 is programmed with the following equations:

$X'[0] = X[0]\text{^}X[1]$ $X'[1] = (X[0]\text{^}X[1])*X[16]$ $X'[2] = !X[2]\text{^}X[3]$ $X'[3] = (!X[3]\text{^}X[4]\text{^}X[5]\text{^}X[6]) + (X[7]\text{^}X[8])*(X[9]\text{^}X[10])$ $X'[4] = 1$ $X'[5]$ through $X'[31] = 0$ The select registers (SRA) 410 for the XOR gates 400 are programmed as follows. The SRA[0] is set to 0x00000003. The SRA[1] term is set to 0x00000000 (i.e., the logic function is programmed in the lookup table 440—bit 0). The SRA[2] term is set to 0x0000000C, and the inversion register 405 is programmed to invert the SRA[2] bit position to compensate for the !X[2] term. The SRA[3] term is set to 0x00000000 (i.e., the logic function is programmed in the lookup table 445—bit 2). The SRA[4] is set to 0x00000000, and the inversion register 405 is programmed to invert the SRA[4] bit position to force the value of SRA[4] to 1. The SRA[5] through SRA[31] terms are set to 0x00000000 (i.e., not used). The inversion register 405 is set to 0x00000014 to invert locations 2 and 4.

The select registers (SRB) 410 for the XOR gates 430 are programmed as follows. The SRB[0] term is set to 0x00000003, corresponding to the X[0]^X[1] term. The SRB[1] is set to 0x00010000, corresponding to the X[16] term. The SRB[2] and SRB[3] terms are set to 0x00000000 (i.e., not used). The lookup table 440 is programmed with 0x0008 for the bit 0 term and 0x0000 for the unused bit 1 term.

The select registers (SRC) 410 for the XOR gates 435 are programmed as follows. The SRC[0] term is set to 0x00000078, corresponding to the X[3] ^ X[4]^ X[5] ^ X[6] term. The SRC[1] term is set to 0x00000180, corresponding to the X[7] ^ X[8] term. The SRC[2] term is set to 0x00000600, corresponding to the X[9] ^ X[10] term. The SRC[3] term is set to 0x00000000 (i.e., not used). The lookup table 445 is programmed with 0x00D0 for the bit 2 term and 0x0000 for the unused bit 3 term.

The LTEN register 455 is set to 0x0000000000000000000000000004010 to enable the look-up table bit 0 to be combined with X'[1] and the look-up table bit 2 to be combined with X'[3].

Now, an example illustrating the programming of the data topology generator 115 is provided. The outputs of the lookup tables 525 and 530 are referred to as OUTA and OUTB, respectively. The data topology generator 115 is programmed with the following equations:

$$OUTA = (X'[0]\char`\^X'[1])\char`\^((!X'[3]\char`\^X'[4]\char`\^X'[5]\char`\^X'[6]) + (X'[7]\char`\^X'[8])*(X'[9]\char`\^X'[10]))$$

$$OUTB = X'[0]\char`\^X'[2]$$

The select registers (SRDC) 410 for the common XOR gates 500 are programmed as follows. The SRDC[0] term is set to 0x00000003, corresponding to the X'[0]^X'[1] term. The SRDC[1] through SRDC[6] terms are set to 0x00000000 (i.e., not used).

The select registers (SRDA) 410 for the "A" lookup table 525 are programmed as follows. The SRDA[0] term is set to 0x00000078, corresponding to the X'[3]^X'[4]^X'[5]^X'[6] term. The SRDA[1] term, is set to 0x00000180, corresponding to the X'[1]^X'[8] term. The SRDA[2] term is set to 0x00000600, corresponding to the X'[9]^X'[10] term. The select register 410 for the bypass XOR gate 510 is set to 0x00000000 (i.e., not used).

The select registers (SRDB) 410 for the "B" lookup table 530 are programmed as follows The SRDB[0] through SRDB[2] terms are set to 0x00000000 (i.e., not used). The select register 410 for the bypass XOR gate 512 is set to 0x00000007 corresponding to the simple XOR term, X'[0]^X'[1]^X'[2].

The inversion register 420 is set to 0x0080 to invert the SRDA[0] term. As described above, the lookup tables 425, 430 are addressed in a 64×16 arrangement as data is being written to them by the microprocessor 15. The 64 discrete terms are designated as DTRAMA[0–63] for the lookup table 425 and DTRAMB[0–63] for the lookup table 430.

The lookup table 425 is written with DTRAMA[0]0=0 x1FE0 for the function SRDA[3]^(SRDA[0](SRDA[0] OR SRDA[1] AND SRDA[2]). The unused DTRAMA[1] through DTRAMA[63] terms are set to 0x0000. All of the unused DTRAMB[0–63] terms are set to 0x0000.

The examples provided herein serve only to illustrate some of the capabilities of the algorithmic pattern generator 20. In light of this disclosure, one of ordinary skill in the art will be readily able to implement more complicated logic arrangements.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A pattern generator, comprising:
   an address generator adapted to provide a first address having a plurality of address bits;
   an address topology generator including a first plurality of programmable logic gates, each programmable logic gate of the first plurality coupled to receive at least a subset of the plurality of address bits, the first plurality of programmable logic gates generating a second address having a plurality of modified address bits; and
   a data topology generator adapted to receive at least a subset of the plurality of modified address bits and generate write data based on the subset of modified address bits.

2. The pattern generator of claim 1, wherein the address topology generator further includes:
   an inversion register for storing a plurality of inversion bits, wherein at least a subset of the first plurality of programmable logic gates have an associated inversion bit coupled thereto for inverting the outputs of the first subset of programmable logic gates.

3. The pattern generator of claim 1, wherein the address topology generator further includes:
   a second plurality of programmable logic gates, each programmable logic gate of the second plurality being coupled to receive at least a subset of the plurality of address bits, the second plurality of programmable logic gates generating a lookup address; and
   a lookup table having a lookup table output and being adapted to receive the lookup address and provide lookup data based on the lookup address.

4. The pattern generator of claim 3, wherein the address topology generator further includes a first logic gate having a first input coupled to the lookup table, a second input coupled to at least one of the first subset of programmable gates, and an output, at least one of the modified address bits being based on the output of the first logic gate.

5. The pattern generator of claim 4, wherein the first logic gate comprises an exclusive OR logic gate.

6. The pattern generator of claim 4, wherein the address topology generator further includes:
   a lookup table enable register for storing a plurality of lookup enable bits; and
   a second logic gate having a first input coupled to a lookup table bit of the lookup table enable register, a second input being coupled to the lookup table, and an output coupled to the first logic gate.

7. The pattern generator of claim 4, wherein the second logic gate comprises an AND logic gate.

8. The pattern generator of claim 3, wherein the address topology generator further includes a select register for storing a plurality of select bits, the select register being coupled to the second plurality of programmable gates for masking ones of the subset of the plurality of address bits.

9. The pattern generator of claim 1, wherein the address topology generator further includes a select register for storing a plurality of select bits, the select register being coupled to the first plurality of programmable gates for masking ones of the subset of the plurality of address bits.

10. The pattern generator of claim 1, wherein the data topology generator is further adapted to generate expected data based on the subset of the plurality of modified address bits.

11. The pattern generator of claim 10, wherein the data topology generator is adapted to receive an inversion input and invert the expected data based on the inversion input.

12. The pattern generator of claim 1, wherein the data topology generator includes:
   a second plurality of programmable logic gates, each programmable logic gate of the second plurality being coupled to receive at least a subset of the plurality of modified address bits, the second plurality of programmable logic gates generating a lookup address; and
   a lookup table having a lookup table output and being adapted to receive the lookup address and provide lookup data based on the lookup address.

13. The pattern generator of claim 12, wherein the data topology generator further includes:
   a control register for storing control bits; and
   a first logic gate having a first input coupled to the lookup table, a second input coupled to a control bit of the control register, and an output, the write data being based on the output of the first logic gate.

14. The pattern generator of claim 12, wherein the data topology generator further includes a bypass programmable gate having an output and being coupled to receive at least a subset of the plurality of modified address bits, the write data being based the output of the bypass programmable gate.

15. The pattern generator of claim 12, wherein the data topology generator further includes a select register for storing a plurality of select bits, the select register being coupled to the second plurality of programmable gates for masking ones of the subset of the plurality of modified address bits.

16. The pattern generator of claim 12, wherein the data topology generator further includes an inversion register for storing a plurality of inversion bits, wherein at least a subset of the second plurality of programmable gates have an associated inversion bit coupled thereto for inverting the outputs of the second subset of programmable gates.

17. The pattern generator of claim 1, further comprising:
a micro-sequencer adapted to receive test instructions and change the value of the first address in the address generator based on the test instructions.

18. The pattern generator of claim 1, wherein the data topology generator is adapted to receive an inversion input and invert the write data based on the inversion input.

19. The pattern generator of claim 1, wherein the programmable logic gates comprise exclusive OR logic gates.

20. The pattern generator of claim 1, further comprising:
a microprocessor adapted to control the address generator to update the first address based on a plurality of instructions, the microsequencer including:
an instruction queue indexed by an instruction pointer and adapted to store instructions for updating the first address, the instructions capable of being nested in a plurality of loop levels;
a plurality of loop counters adapted to store a remaining number of iterations associated with an associated loop level; and
a plurality of loop instruction pointer registers associated with the loop counter and adapted to store a loop instruction pointer value associated with a particular one of the instructions marking the start of the associated loop level, wherein the microsequencer is adapted to load the instruction pointer with the loop instruction pointer value associated with the loop level in response to the remaining number of iterations for the loop level equaling zero.

21. The pattern generator of claim 20, wherein the microsequencer further includes a plurality of loop count registers adapted to store a total number of iterations associated with an associated loop level, and the microsequencer is adapted to load the loop counter associated with the loop level with the total number of iterations when the particular one of the instructions marking the start of the associated loop level is encountered.

22. The pattern generator of claim 20, wherein the microsequencer further includes a repeat counter adapted to store a repeat value indicating a number of remaining repeat iterations of a selected one of the instructions.

23. The pattern generator of claim 22, wherein the microsequencer further comprises a repeat count register adapted to store a total number of repeat iterations associated with the selected one of the instructions.

24. The pattern generator of claim 20, wherein the address generator includes a plurality of address registers and the microsequencer is adapted to update the address register based on the instructions.

25. A system for testing a device having an address topology and a data topology, comprising:
a microprocessor adapted to provide a plurality of test instructions;
a pattern generator adapted to receive the test instructions and provide a second address for accessing the device, the second address having a plurality of modified address bits and being based on the address topology of the device, the pattern generator comprising:
an address generator adapted to provide a first address, the first address having a plurality of address bits;
a micro-sequencer adapted to receive the test instructions and update the first address based on the test instructions;
an address topology generator including a first plurality of programmable logic gates, each programmable logic gate of the first plurality coupled to receive at least a subset of the plurality of address bits, the first plurality of programmable logic gates generating the second address having a plurality of modified address bits, the second address being a logical combination of the subset of the plurality of address bits, the logical combination being based on the address topology of the device; and
a data topology generator adapted to receive at least a subset of the plurality of modified address bits and generate write data based on the subset of the modified address bits and the data topology of the device; and
a timing signal generator adapted to generate timing signals for accessing the device.

26. The system of claim 25, further comprising:
a multiplexer coupled to the pattern generator and adapted to receive first and second subsets of the second address, the first subset defining a row address and the second subset defining a column address, wherein an output of the multiplexer is coupled to the device for providing one of the row address and the column address to access the device.

27. The system of claim 26, wherein the multiplexer has a control input coupled to the timing signal generator, the timing signal generator being adapted to select one of the row address and the column address based on the timing signals.

28. The system of claim 25, wherein the data topology generator is further adapted to generate expected data based on the subset of the plurality of modified address bits.

29. The system of claim 28, further comprising:
a comparator adapted to receive the expected data and output data from the device, compare the expected data and output data, and provide a test indicator to the microprocessor based on the comparison.

30. The pattern generator of claim 28, wherein the data topology generator is adapted to receive an inversion input and invert the expected data based on the inversion input.

31. The system of claim 25, wherein the data topology generator includes:
a second plurality of programmable logic gates, each programmable logic gate of the second plurality being coupled to receive at least a subset of the plurality of address bits, the second plurality of programmable logic gates generating a lookup address; and
a lookup table having a lookup table output and being adapted to receive the lookup address and provide lookup data based on the lookup address.

32. The system of claim 25, wherein the data topology generator further includes:
a second plurality of programmable logic gates, each programmable logic gate of the second plurality being coupled to receive at least a subset of the plurality of modified address bits, the second plurality of programmable logic gates generating a lookup address; and
a lookup table having a lookup table output and being adapted to receive the lookup address and provide lookup data based on the lookup address.

33. The system of claim 25, wherein the data topology generator further includes:
a control register for storing control bits; and
a first logic gate having a first input coupled to the lookup table, a second input coupled to control bit of the control register, and an output, the write data being based on the output of the first logic gate.

34. The system of claim 25, wherein the data topology generator is adapted to receive bypass programmable gate having an output and being coupled to receive at least a subset of the plurality of modified address bits, the write data being based the output of the bypass programmable gate.

35. The system of claim 25, wherein the data topology generator is adapted to receive an inversion input and invert the write data based on the inversion input.

36. The pattern generator of claim 25, wherein the programmable logic gates comprise exclusive OR logic gates.

37. A method for generating a pattern, comprising:
generating a first address having a plurality of address bits;
generating a second address having a plurality of modified address bits, the second address comprising a programmable combination of subsets of the address bits; and
generating write data based on a subset of the modified address bits.

38. The method of claim 37, wherein generating the second address includes inverting at least one of the modified address bits.

39. The method of claim 37, wherein generating the second address includes:
generating a lookup address based on a programmable combination of subsets of the address bits; and
accessing a lookup table with the lookup address to generate lookup data; and
generating at least one of the modified address bits based on the lookup data.

40. The method of claim 37, further comprising generating expected data based on the subset of the plurality of modified address bits.

41. The method of claim 37, wherein generating the write data includes:
generating a lookup address based on a programmable combination of subsets of the modified address bits; and
accessing a lookup table with the lookup address to generate lookup data; and
generating at least a portion of the write data based on the lookup data.

42. The method of claim 37, further comprising inverting the write data.

43. The method of claim 37, further comprising providing a plurality of instructions, wherein generating the first address includes generating the first address based on the instructions.

44. The method of claim 43, wherein providing the instructions includes:
storing the plurality of instructions in an instruction queue indexed by an instruction pointer;
identifying a first instruction marking the start of a first loop, the first instruction having a first loop instruction pointer value;
storing a remaining number of iterations for the first loop in a first loop counter; and
loading the instruction pointer with the first loop instruction pointer value in response to the remaining number of iterations for the first loop equaling zero.

45. The method of claim 44, further comprising storing the first instruction pointer value in a first loop instruction pointer register.

46. The method of claim 44, further comprising:
identifying a second instruction nested within the first loop and marking the start of a second loop, the second instruction having a second loop instruction pointer value;
storing a remaining number of iterations for the second loop in a second loop counter; and
loading the instruction pointer with the second loop instruction pointer value in response to the remaining number of iterations for the second loop equaling zero.

47. The method of claim 44, further storing a total number of iterations associated with the first loop in a first loop count register.

48. The method of claim 47, further comprising:
identifying a second instruction marking the end of the first loop; and
loading the first loop counter with the total number of iterations when the second instruction is first encountered.

49. The method of claim 44, further comprising:
identifying a second instruction to be repeated;
storing a repeat value indicating a number of remaining repeat iterations for the second instruction in a repeat counter; and
repeating the second instruction and decrementing the repeat counter until the number of remaining repeat iterations for the second instruction equals zero.

50. The method of claim 44, further comprising:
storing a total number of repeat iterations associated with the second instruction in a repeat count register; and
loading the repeat counter with the total number of iterations in response to first encountering the second instruction.

51. A method for testing a device having an address topology and a data topology, comprising:
providing a plurality of test instructions;
providing a first address having a plurality of address bits;
updating the first address based on the test instructions;
programming a first plurality of programmable logic gates, each programmable logic gate of the first plurality coupled to receive at least a subset of the plurality of address bits, the first plurality of programmable logic gates generating a second address having a plurality of modified address bits, the second address being a logical combination of the first address, the logical combination being based on the address topology of the device; and
generating write data based on at least a subset of the plurality of modified address bits and the data topology of the device;
generating timing signals for accessing the device; and accessing the device based on the second address and the write data.

52. The method of claim 51, further comprising:

defining a row address based on a first subset of the second address and a column address based on a second subset of the second address;

selecting one of the row address and the column address to access the device.

53. The method of claim 52, further comprising selecting one of the row address and the column address based on the timing signals.

54. The method of claim 51, further comprising generating expected data based on the subset of the plurality of modified address bits.

55. The method of claim 54, further comprising:

receiving output data from the device;

comparing the expected data and output data; and providing a test indicator based on the comparison.

56. The method of claim 51, further comprising:

programming a second plurality of programmable logic gates, each programmable logic gate of the second plurality being coupled to receive at least a subset of the plurality of address bits, the second plurality of programmable logic gates generating a lookup address;

accessing a lookup table based on the lookup address to provide lookup data; and generating at least one of the modified address bits based on the lookup data.

57. The method of claim 51, further comprising:

programming a second plurality of programmable logic gates, each programmable logic gate of the second plurality being coupled to receive at least a subset of the plurality of modified address bits, the second plurality of programmable logic gates generating a lookup address;

accessing a lookup table based on the lookup address to provide lookup data; and generating at least a portion of the write data based on the lookup data.

58. A pattern generator, comprising:

an address generator adapted to provide a first address having a plurality of address bits;

a microsequencer adapted to control the address generator to update the first address, the microsequencer including:

an instruction queue indexed by an instruction pointer and adapted to store instructions for updating the first address, the instructions capable of being nested in a plurality of loop levels;

a plurality of loop counters adapted to store a remaining number of iterations associated with an associated loop level; and a plurality of loop instruction pointer registers associated with the loop counter and adapted to store a loop instruction pointer value associated with a particular one of the instructions marking the start of the associated loop level, wherein the microsequencer is adapted to load the instruction pointer with the loop instruction pointer value associated with the loop level in response to the remaining number of iterations for the loop level equaling zero;

an address topology generator adapted to receive at least a subset of the plurality of address bits and generate a second address having a plurality of modified address bits based on a logical combination of the address bits; and a data topology generator adapted to receive at least a subset of the plurality of modified address bits and generate write data based on the subset of modified address bits.

59. The pattern generator of claim 58, wherein the microsequencer further includes a plurality of loop count registers adapted to store a total number of iterations associated with an associated loop level, and the microsequencer is adapted to load the loop counter associated with the loop level with the total number of iterations when the particular one of the instructions marking the start of the associated loop level is encountered.

60. The pattern generator of claim 58, wherein the microsequencer further includes a repeat counter adapted to store a repeat value indicating a number of remaining repeat iterations of a selected one of the instructions.

61. The pattern generator of claim 60, wherein the microsequencer further comprises a repeat count register adapted to store a total number of repeat iterations associated with the selected one of the instructions.

62. The pattern generator of claim 58, wherein the address generator includes a plurality of address registers and the microsequencer is adapted to update the address register based on the instructions.

63. A pattern generator, comprising:

means for generating a first address having a plurality of address bits;

means for generating a second address having a plurality of modified address bits, the second address comprising a programmable combination of subsets of the address bits; and means for generating write data based on a subset of the modified address bits.

* * * * *